United States Patent [19]
Mu

[11] Patent Number: 5,063,432
[45] Date of Patent: Nov. 5, 1991

[54] INTEGRATED CIRCUIT LEAD ASSEMBLY STRUCTURE WITH FIRST AND SECOND LEAD PATTERNS SPACED APART IN PARALLEL PLANES WITH A PART OF EACH LEAD IN ONE LEAD PATTERN PERPENDICULAR TO A PART OF EACH LEAD IN THE OTHER LEAD PATTERN

[75] Inventor: Albert T. Mu, San Jose, Calif.
[73] Assignee: Advanced Micro Devices, Inc., Sunnyvale, Calif.
[21] Appl. No.: 552,351
[22] Filed: Jul. 16, 1990

Related U.S. Application Data

[63] Continuation of Ser. No. 354,647, May 22, 1989, abandoned.
[51] Int. Cl.[5] .................. H01L 23/48; H01L 29/44; H01L 29/52; H01L 29/60
[52] U.S. Cl. .................................... 357/70; 357/68; 357/71; 357/80; 361/404
[58] Field of Search .................. 357/68, 70, 80, 71; 361/404, 414, 421

[56] References Cited

U.S. PATENT DOCUMENTS

| | | | |
|---|---|---|---|
| 3,118,016 | 1/1964 | Stephenson, Jr. | 361/414 |
| 3,550,766 | 12/1970 | Nixen | 357/70 |
| 3,676,922 | 7/1972 | Cook, Jr. | 29/577 |
| 3,715,635 | 2/1973 | Michel et al. | 317/234 R |
| 3,777,221 | 12/1973 | Tatusko et al. | 361/414 |
| 4,254,445 | 3/1981 | Ho | 361/392 |
| 4,288,841 | 9/1981 | Gogal | 361/414 |
| 4,423,468 | 12/1983 | Gatto et al. | 361/404 |
| 4,626,889 | 12/1986 | Yamamoto et al. | 357/71 |
| 4,680,617 | 7/1987 | Ross | 357/72 |
| 4,704,187 | 11/1987 | Fujita | 156/645 |
| 4,788,584 | 11/1988 | Hirano et al. | 357/81 |
| 4,801,999 | 1/1989 | Hayward et al. | 357/70 |

FOREIGN PATENT DOCUMENTS

| | | |
|---|---|---|
| 58-14544 | 1/1983 | Japan . |
| 61-5545 | 1/1986 | Japan . |
| 7610306 | 9/1976 | Netherlands . |

OTHER PUBLICATIONS

Halliday et al., *Fundamentals of Physics*, pp. 560–561, 1981.

*Primary Examiner*—Andrew J. James
*Assistant Examiner*—Stephen D. Meier
*Attorney, Agent, or Firm*—John P. Taylor

[57] ABSTRACT

An integrated circuit lead assembly structure is disclosed which comprises one or more pc boards, having a first lead pattern adjacent one surface of a pc board and a second lead pattern adjacent another surface of a pc board with at least a portion of the leads of the first lead pattern running perpendicular to corresponding leads of the second lead pattern to reduce crosstalk and coupling between the leads. An array of bonding pads is provided on one surface of the structure together with a die mounting area and electrical connection is made from the bonding pads to leads not on the same surface through vias or plated-through holes which respectively pass through the structure from the bonding pad to the appropriate lead. When a laminate of several pc boards is used, power and/or ground electrodes may be provided on other surfaces and also electrically connected to one or more bonding pads. Means for electrically compensating for the uneven length of the leads are also disclosed as well as decoupling capacitors mounted on the assembly and electrically connected between the power and ground electrodes.

19 Claims, 5 Drawing Sheets

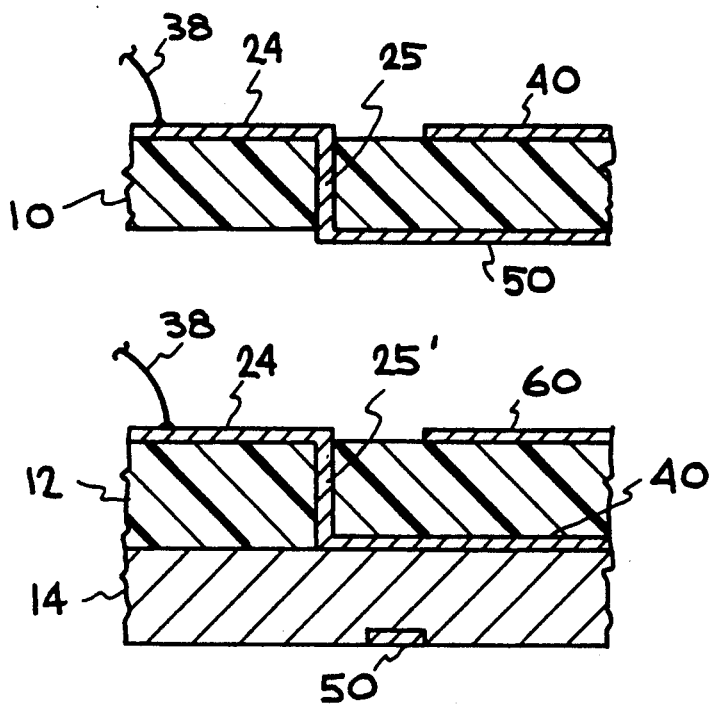
FIG. 6
FIG. 7
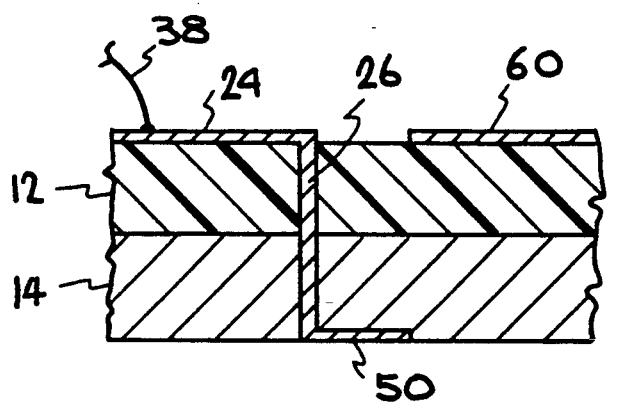
FIG. 8
FIG. 9

INTEGRATED CIRCUIT LEAD ASSEMBLY STRUCTURE WITH FIRST AND SECOND LEAD PATTERNS SPACED APART IN PARALLEL PLANES WITH A PART OF EACH LEAD IN ONE LEAD PATTERN PERPENDICULAR TO A PART OF EACH LEAD IN THE OTHER LEAD PATTERN

This application is a continuation of application U.S. Ser. No. 07/354,647, filed May 22, 1989 now abandoned.

BACKGROUND OF THE INVENTION

1. Field of the Invention

This invention relates to improved packaging for integrated circuit structures. More particularly, this invention relates to an improved lead assembly for an integrated circuit structure to reduce crosstalk and coupling and provide additional improvements.

2. Description of the Related Art

In the conventional packaging of integrated circuit structures with traditional leadframe patterns, the die may be attached to the center paddle of a metal lead frame which has a plurality of metal leads which fan out from a series of bonding pads arranged around the four sides of the die. The respective widths of these leads may vary along their lengths from their inner ends, adjacent the die, to the outer ends of the leads. The respective lengths of these leads will also show a large difference.

In addition, the generally parallel spacing and long coupling lengths between the leads, which extends all the way to the outside perimeter of the package, can result in coupling of the signals on adjacent leads. Varying widths among these leads means that characteristic impedance levels are not controlled and matched which can result in signal reflection. The varying of the lead lengths may result in differences in signal propagation delay.

In Hayward et al U.S. Pat. No. 4,801,999, which is assigned to the assignee of this invention, there is shown a lead assembly in which leads and busses are arranged on both sides of a dielectric layer. However, the leads are still arranged around the die in generally parallel configuration to adjacent leads.

It would, therefore, be desirable to provide an integrated circuit lead assembly structure wherein coupling and crosstalk between adjacent signal lines can be controlled, signal reflection can be minimized, and signal propagation delay can be equalized.

SUMMARY OF THE INVENTION

It is, therefore, an object of this invention to provide an improved integrated circuit lead assembly structure wherein coupling and crosstalk between adjacent signal leads is minimized or eliminated by crossing adjacent signal leads at some point along the length of the leads, the integrated circuit lead assembly structure comprising a pc board having a first lead frame pattern adjacent one surface of the board and a second lead pattern adjacent the opposite surface of the pc board with at least a portion of the leads in the first lead pattern positioned adjacent one surface of the board running perpendicular to corresponding leads in the second lead pattern positioned adjacent the opposite surface of the pc board to reduce crosstalk and coupling between the leads.

It is yet another object of this invention to provide an improved integrated circuit lead assembly structure comprising a pc board with spaced apart bonding pads mounted on a first surface of the board around a central die-mounting portion with generally alternate bonding pads electrically communicating through vias or plated through holes with leads in a lead pattern positioned generally adjacent the opposite surface of the pc board with a majority of the remaining bonding pads electrically communicating with leads of a lead pattern disposed adjacent the first surface of the pc board so that adjacent bonding pads communicate with leads on opposite surfaces of the pc board.

It is still another object of this invention to provide an improved integrated circuit lead assembly structure comprising a generally rectangular pc board with spaced apart bonding pads centrally mounted on a first surface of the board in a rectangular array around a central die-mounting portion with generally alternate bonding pads electrically communicating through vias or plated through holes with leads in a lead pattern positioned generally adjacent the opposite surface of the pc board, wherein the lead pattern on the opposite surface of the pc board comprises generally straight leads extending in parallel from two opposite sides of the rectangular bonding pad array to the outer edges of two opposite sides of the rectangular pc board and the leads from the other two sides of the rectangular bonding pad array extending parallel from the bonding pads and then turning at right angles in staircase fashion to extend parallel to one another and parallel to the leads extending from the first two opposite sides of the bonding pad array so that all of the leads in the lead pattern on the opposite side of the pc board terminate on two opposite end edges of the pc board and a similar lead frame pattern is disposed adjacent the first surface of the pc board with the two lead patterns rotated 90° from one another so that all of the leads of the lead pattern disposed adjacent the first surface of the pc board terminate on the two opposite outer edges of the pc board adjacent to the two opposite outer edges at which the leads of the lead pattern disposed adjacent the opposite surface of the pc board terminate so that leads in one lead pattern are not parallel to leads on the other pattern electrically connected to adjacent bonding pads.

It is a further object of this invention to provide an improved integrated circuit lead assembly structure comprising a pc board having a first lead frame pattern adjacent a first surface of the board with spaced apart bonding pads centrally mounted on the first surface of the board in a rectangular array around a central die-mounting portion with generally alternate bonding pads electrically connected to leads on the first lead frame structure and bonding pads between the alternate bonding pads electrically communicating through vias or plated through holes with leads in a second lead pattern positioned generally adjacent the opposite surface of the pc board, with portions of the leads in the first lead frame structure running perpendicular to corresponding leads in the second lead frame structure and wherein means are also provided on at least a portion of the leads to provide capacitive loading networks to electrically compensate for uneven lead lengths to equalize the signal propagation delays.

It is yet a further object of this invention to provide an improved integrated circuit lead assembly structure comprising a laminate of a plurality of pc boards having surfaces lying in parallel planes, the structure comprising one or more power and ground electrodes positioned respectively adjacent separate surfaces of the laminate, a first lead pattern positioned generally adjacent another surface of one of the pc boards in the laminate, a second lead pattern positioned generally adjacent yet another surface of one of the pc boards in the laminate with portions of the leads in the first lead pattern running perpendicular to corresponding leads in the second lead pattern, and spaced apart bonding pads centrally mounted in a rectangular array around a central die-mounting portion adjacent an outer surface of the laminate, with generally alternate bonding pads electrically connected respectively to leads of the first and second lead patterns through vias or plated through holes leading from the outer surface to the surfaces in the laminate in which the respective leads lie in the first and second lead patterns, and one or more bonding pads are electrically connected with the power electrode and/or the ground electrode.

It is a still further object of this invention to provide an improved integrated circuit lead assembly structure comprising a laminate of a plurality of pc boards having surfaces lying in parallel planes, the structure comprising one or more power and ground electrodes positioned respectively adjacent separate surfaces of the laminate, a first lead pattern positioned generally adjacent a surface of one of the pc boards in the laminate, a second lead pattern positioned generally adjacent yet another surface of one of the pc boards in the laminate with portions of the leads in the first lead pattern running perpendicular to corresponding leads in the second lead pattern, and spaced apart bonding pads centrally mounted in a rectangular array around a central die-mounting portion adjacent an outer surface of the laminate, with generally alternate bonding pads electrically connected respectively to leads on the first and second lead patterns through vias or plated through holes leading from the outer surface to the surfaces in the laminate in which the respective leads in the first and second lead patterns lie, and one or more bonding pads are electrically connected, through vias, with the power electrode and/or the ground electrode and wherein decoupling capacitor means are mounted to one outer surface of the laminate and electrically connected between the power and ground electrodes to reduce power supply voltage transients.

These and other objects of the invention will be apparent from the following description and accompanying drawings.

BRIEF DESCRIPTION OF THE DRAWINGS

FIG. 6 is a fragmentary side section view showing a lead of the first lead pattern on the top surface of a pc board as well as a bonding pad with a via extending through the pc board to provide electrical connection between the bonding pad and a lead from the second lead pattern shown disposed adjacent the opposite surface of the pc board.

FIG. 7 is a fragmentary side section view showing a laminate of two pc boards with a Vcc electrode on the top surface of the first pc board, as well as a bonding pad with a via extending through the first pc board to provide electrical connection between the bonding pad and a lead from a first lead pattern shown disposed adjacent the top surface of a second pc board, and also showing a portion of a lead of a second lead pattern adjacent the bottom surface of the second pc board.

FIG. 8 is a fragmentary side section view of the laminate of FIG. 7 taken at a different point to show another bonding pad electrically connected to a via which extends through both pc boards to provide electrical connection between the bonding pad and a lead from the second lead pattern shown disposed adjacent the bottom surface of the second pc board.

FIG. 9 is a fragmentary side section view showing a laminate of three pc boards with a power electrode on the upper surface of the uppermost pc board, a lead from a first lead pattern shown disposed adjacent the top surface of a second pc board, a portion of a lead of a second lead pattern disposed adjacent the top surface of a third pc board, and a bonding pad also disposed on the upper surface of the top pc board and electrically connected to a via or plated through holes which extends through all the pc boards to provide electrical connection between the bonding pad and a power electrode on the bottom surface of the third pc board.

DETAILED DESCRIPTION OF THE INVENTION

The invention comprises an improved integrated circuit lead assembly structure which, in its simplest embodiment, comprises a pc board having a first lead pattern adjacent one surface of the board and a second lead pattern adjacent the opposite surface of the pc board with at least a portion of the leads positioned adjacent one surface of the pc board running perpendicular to corresponding leads positioned adjacent the opposite surface of the pc board.

Figure 1:
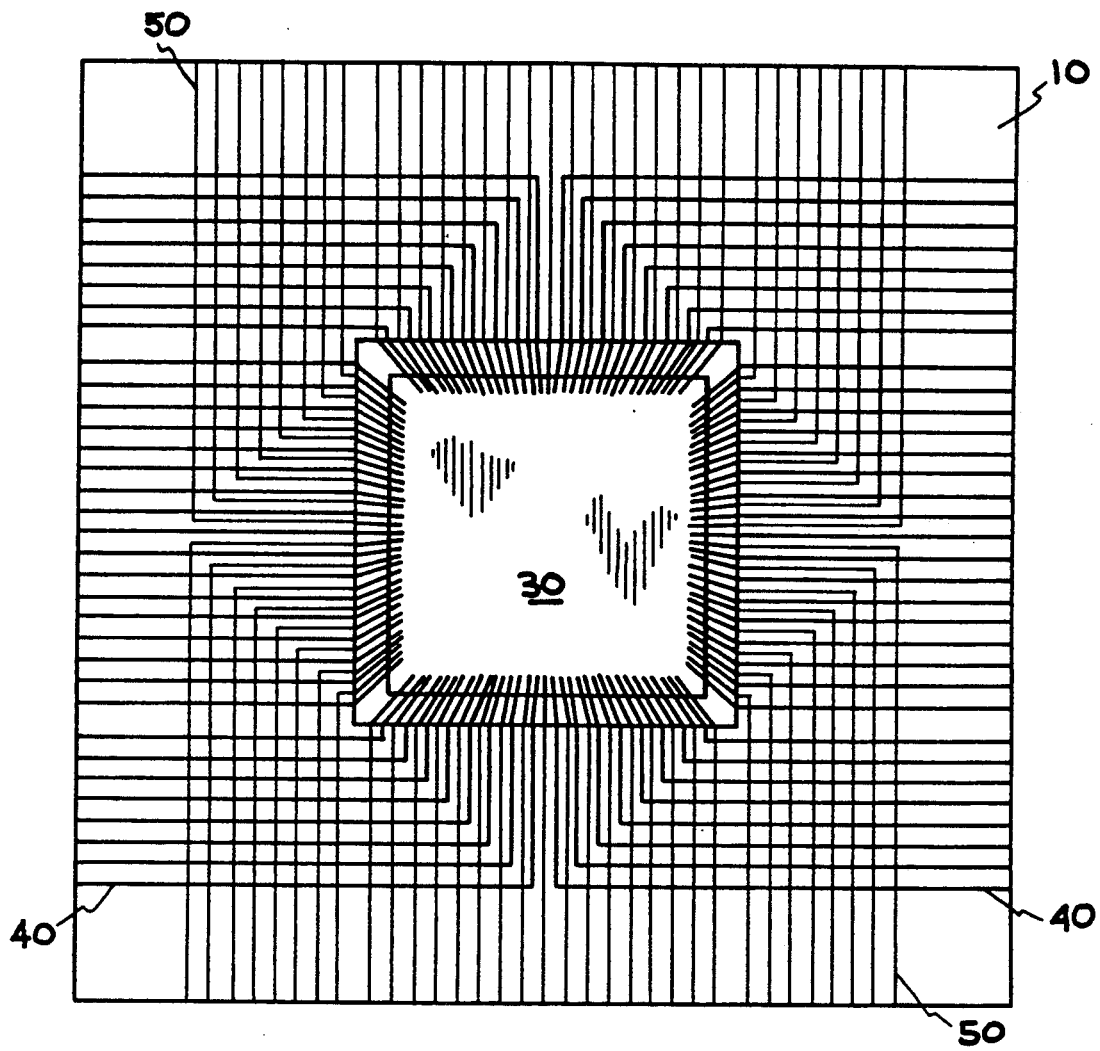
FIG. 1 is a top view generally showing the lead assembly structure of the invention as it would be viewed from the top with a transparent pc board so that leads disposed on opposite surfaces of the pc board can be seen.

Referring to FIG. 1, the lead assembly structure of the invention is shown in its simplest form comprising a single pc board 10 having a first lead pattern 40 formed on the upper surface of pc board 10 and a second lead pattern 50 formed on the lower surface of pc board 10. For illustration purposes only, pc board 10 is illustrated in FIG. 1 as transparent so that both lead patterns 40 and 50 can be seen.

It will be seen that lead pattern 40 is configured so that all of the leads extend to two opposite edges of the upper surface of pc board 10 while lead pattern 50 is configured so that all of the leads extend to the other two edges of pc board 10. In doing so all of the leads in lead pattern 40 (except for the middle lead shown on each opposite side in FIG. 1) cross one or more leads in lead pattern 50 at a 90° angle and likewise all of the leads in lead pattern 50 (except for the middle lead shown on each opposite side in FIG. 1) cross at least one lead in lead pattern 40 at a 90° angle. This 90° lead crossing between the leads of the two lead patterns reduces the coupling between adjacent leads as will be discussed below with regard to FIGS. 4 and 5.

The pc board 10, or any of the other pc boards to be discussed below, may be constructed of insulating plastic materials such as polyimides or any other equivalent plastic material, or they may comprise ceramic materials. The metals used to form the lead patterns on the pc boards may comprise any conductive metal which is compatible with the other materials used in the assembly or in the encapsulation materials. Aluminum or copper are conventionally used as lead pattern materials because of their conductivity, although gold or silver or other precious metals may also be used if the added expense of the use of such materials is justified in a particular application.

Figure 2:
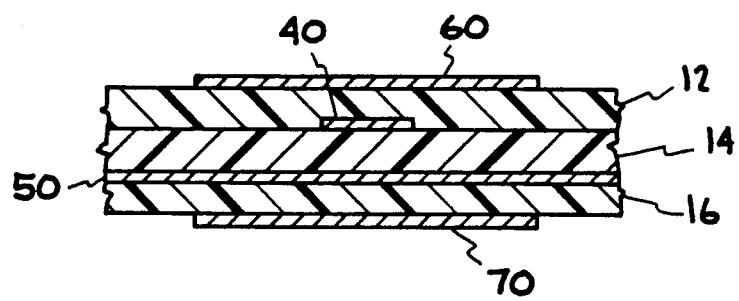
FIG. 2 is a fragmentary side section view of the lead assembly structure shown as a laminate comprising a plurality of pc boards with a power electrode on the top surface of the laminate, a portion of a first lead pattern adjacent a second surface of the laminate, a portion of a second lead pattern adjacent a third surface of the laminate, and a ground electrode on the bottom surface of the laminate.
Figure 3:
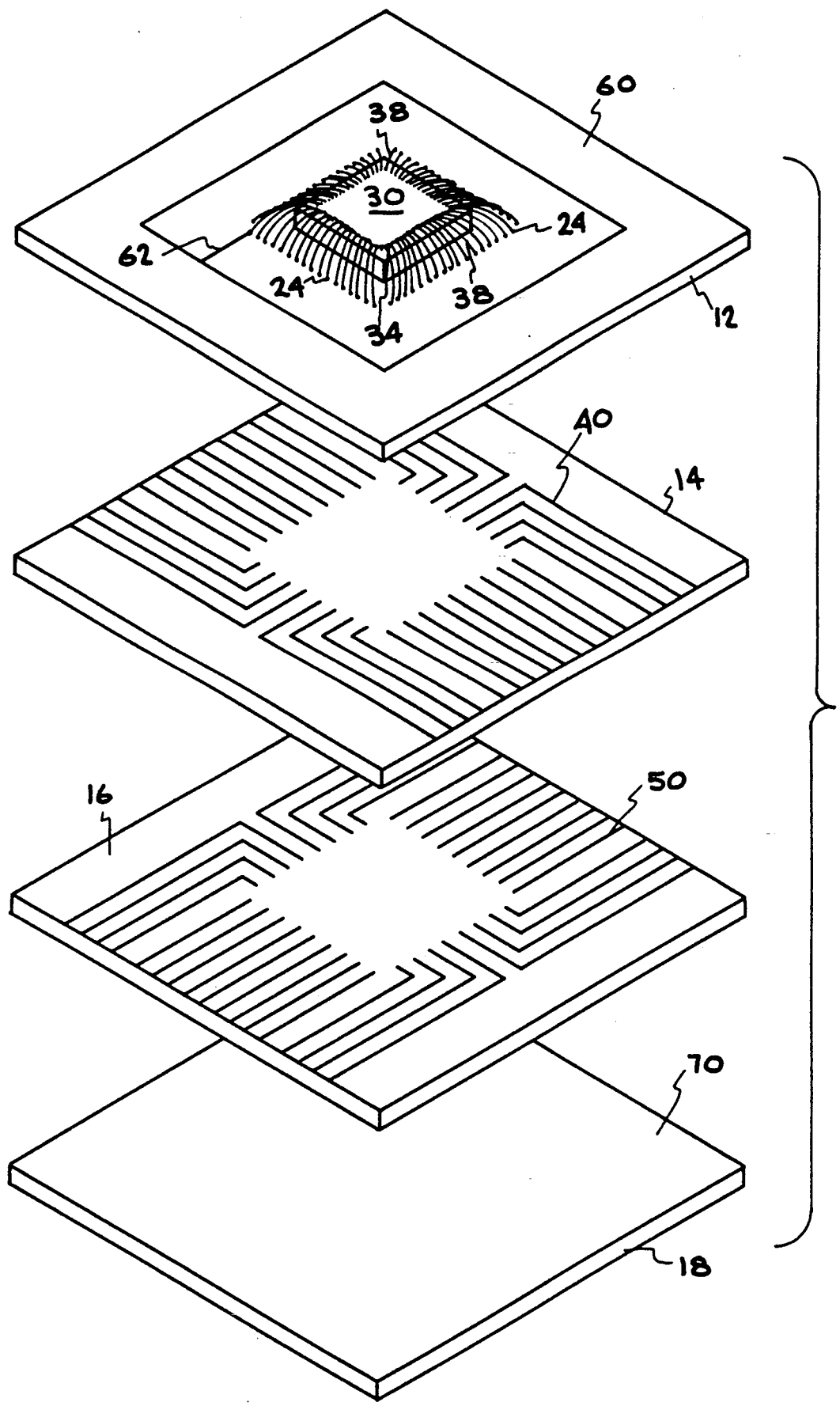
FIGS. 3 is an exploded view showing the lead assembly structure of the invention as a four layer laminate with a power electrode on the top surface, as well as a central die mounting area and a rectangular array of bonding pads surrounding the die mounting area, a first lead pattern formed on the top surface of a second pc board, a second lead pattern formed on the top surface of a third pc board, and a ground electrode which is shown formed (for illustration purposes only) on the top surface of a fourth pc board, it being understood that the ground electrode would normally be formed on the bottom surface of the third pc board to eliminate the need for use of a fourth pc board.

Referring now to FIG. 2 and 3, another embodiment of the invention is shown wherein a plurality of pc boards have been used to form a laminate having a solid power electrode 60, e.g., a Vcc or Vdd power bus, formed on the upper surface of top pc board 12, lead pattern 40 formed either on the top surface of a second pc board 14 or on the lower surface of pc board 12, lead pattern 50 formed either on the top surface of a third pc board 16 or on the lower surface of pc board 14, and a solid ground electrode, e.g., a Vee or Vss ground bus, formed on the lower surface of pc board 16 (as shown in FIG. 2) or on the upper surface of a fourth pc board 18 (as shown in FIG. 3). While power and ground electrodes 60 and 70 and lead patterns 40 and 50 would normally be formed on the respective surfaces of three pc boards, a fourth board could be utilized and has been used in FIG. 3 for illustrative purposes.

Still referring to FIG. 3, die 30 is shown centrally mounted on pc board 12 and having a number of bonding pads 34 arranged around the periphery of die 30 which are connected by leads 38 to corresponding bonding pads 24 arranged in rectangular fashion around die 30 on the upper surface of pc board 12. A lead 62 is shown which, in turn, connects one of the bonding pads 24 with power electrode 60. While several of the bonding pads on die 30 may be connected through an appropriate bonding pad 24 in this manner to power bus electrode 60, the remainder of bonding pads 24 communicate respectively with the leads in lead patterns 40 and 50, as well as with ground lead electrode 70 through vias or plated-through holes formed in the pc boards as will be discussed below with respect to FIGS. 6-9.

Figure 4:
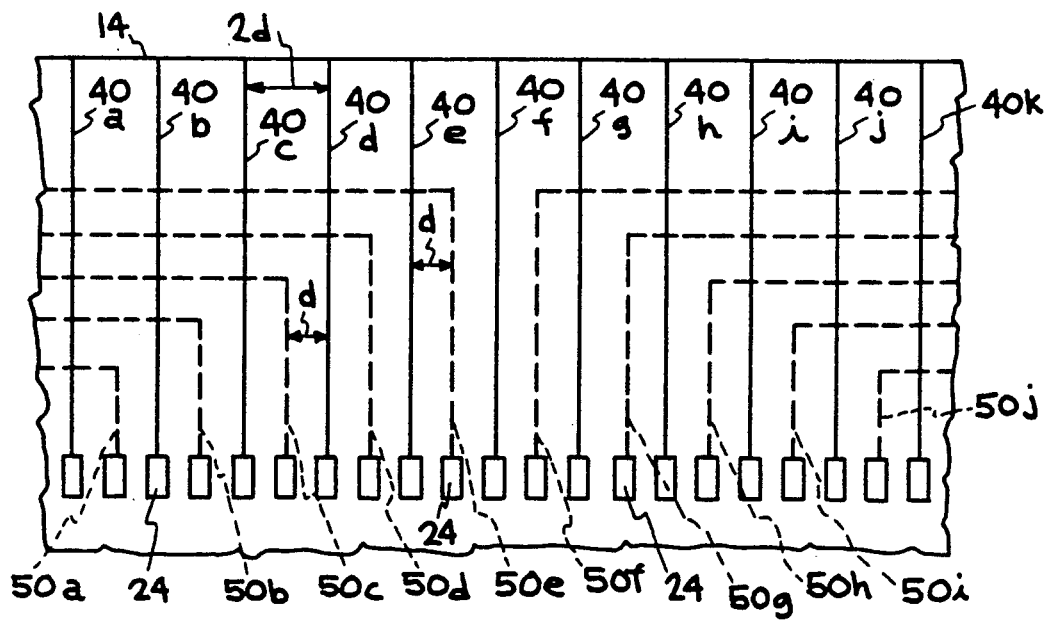
FIG. 4 is a fragmentary top view of a portion of the surface of the lead assembly structure showing one side of the structure having the first lead pattern mounted adjacent the top surface of a pc board with a second lead pattern located beneath the pc board and outlined in dotted lines to show the relationship between the leads in the respective lead patterns.
Figure 5:
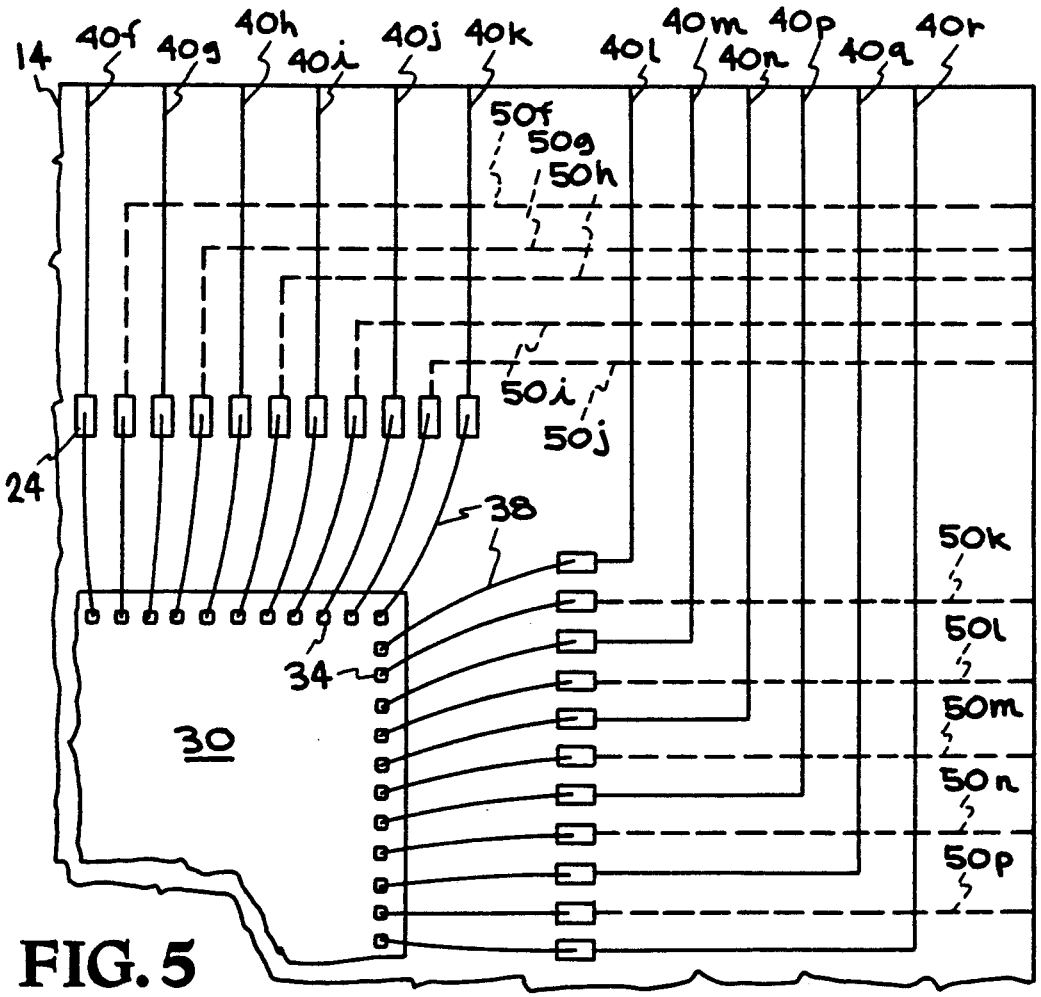
FIG. 5 is another fragmentary top view of a portion of the surface of the lead assembly structure showing portions of two sides of the structure having the first lead pattern mounted adjacent the top surface of a pc board with a second lead pattern located beneath the pc board and outlined in dotted lines to show the relationship between the leads in the respective lead patterns, and in particular how the leads on one pattern terminate on opposite end edges of the structure adjacent to the edges on which the leads in the second pattern terminate.

Turning now to FIGS. 4 and 5, the crossing of the leads in patterns 40 and 50 is shown wherein leads 40a–40r are shown as solid lines while leads 50a–50p are shown as dotted lines. As shown in both figures, the respective adjacent leads 40 and 50, e.g., leads 40f and 50f, are electrically connected to alternating adjacent bonding pads 24 on pc board 12. Such adjacent leads then extend out from the respective bonding pads 24 generally parallel to one another (but on opposite surfaces of pc board 14 and therefore spaced apart by the thickness of pc board 14). However, then one of the lines, e.g., lead 50f, turns at a right angle and then extends in the new direction to the edge of pc board 14, crossing, in the mean time, other leads in lead pattern 40, e.g., leads 40g–40k.

It will, of course, be understood, that the leads in respective lead patterns 40 and 50 do not physically cross one another since the respective lead patterns are separated from one another by the thickness of pc board 14. However, the leads do cross one another from the standpoint of the electrical coupling between adjacent leads which, but for such electrical crossing, would occur if the leads extended parallel to one another for their entire distance, even though separated from one another by pc board 14, since pc board 14 would simply act as the dielectric between the electrodes, i.e., function as the dielectric in a capacitive coupling between the electrodes.

By providing such 90° turns in the respective leads, all of the leads in lead pattern 40 will extend to two opposite edges of pc board 14 while all of the leads in lead pattern 50 will extend to the other two opposite edges of pc board 14 as best seen in FIG. 5 wherein all of the leads 40f–40r in lead pattern 40 are shown (after the 90° turns of leads 40l–40r) running vertical to the top edge of pc board 14 in FIG. 5 while all of the leads 50f–50p in lead pattern 50 are shown (after the 90° turns of leads 50f–50j) extending horizontally to the side edge of pc board 14.

It will be further noted that the lead assembly of the invention provides additional spacing between adjacent leads extending to any edge of the pc board. Thus, for example, where the spacing between leads 50c and 40d, when they first extend out from their respective vias or plated-through holes connecting them to adjacent bonding pads, is shown in FIG. 4 to be a distance d. However, the pitch between leads 40c and 40d, which leads extend parallel to one another to the edge of the pc board, is twice this distance, i.e., 2d. This additional spacing between the leads in lead pattern 40—or the adjacent leads in lead pattern 50—further serves to reduce the coupling and crosstalk between adjacent leads. Thus, for example, when leads having a width of 7 mils are used with a conventional pitch of d=12.5 mils, the effective doubling of this spacing, using the lead assembly structure of the invention, provides a 25 mil spacing between adjacent leads in the same lead pattern.

It should also be noting that the effective doubling of the space between adjacent leads, in accordance with the practice of the invention, provides further freedom to adjust the lead width which is the controlling factor to impedance matching of the leads.

In FIGS. 6–9, there is shown contact being made from bonding pads 24 to the leads and/or electrodes not on the top surface of the assembly by the use of vias or plated-through holes which extend down through one or more pc boards to make electrical contact with the respective leads and/or electrodes. As is well known to those skilled in the art, a via is a hole or bore which is filled with a conductive material, e.g., aluminum.

FIGS. 6 illustrates the use of a single pc board with lead pattern 40 disposed on the top surface of pc board 10 and lead pattern 50 on the bottom surface. A via or plated-through hole 25, which extends through pc board 10, provides electrical contact between bonding pad 24 and a lead in lead pattern 50.

FIG. 7 illustrates the use of vias or plated-through holes in a laminate comprising 2 pc boards with a power electrode 60 on the top surface of upper pc board 12, lead pattern 40 disposed between upper pc board 12 and lower pc board 14 (by either forming lead pattern 40 on the underside of pc board 12 or on the top surface of pc board 14), and lead pattern 50 on the undersurface of pc board 14. A via 25' extends through upper pc board 12 to make contact with a lead of lead pattern 40.

In FIG. 8 another two layer laminate is shown with a power electrode 60 on the top surface of upper pc board 12. In this case lead pattern 40, although present, is not visible in the cross-section shown. A via or plated-through hole 26 is shown extending through both upper pc board 12 and lower pc board 14 to make contact between another bonding pad 24 and a lead of lead pattern 50.

FIG. 9 shows a 3 layer laminate with a power electrode 60 on the top surface of pc board 12 and a ground electrode 70 on the bottom surface of pc board 16. Lead pattern 40 (not visible in this cross-section) is disposed between pc board 12 and pc board 14, while lead pattern 50 (also not visible in the particular cross-section) may be disposed between pc board 14 and pc board 16. A via or plated-through hole 27 extends from a bonding pad 24 down through all 3 layers or boards to make electrical contact with ground electrode 70.

Figure 10:
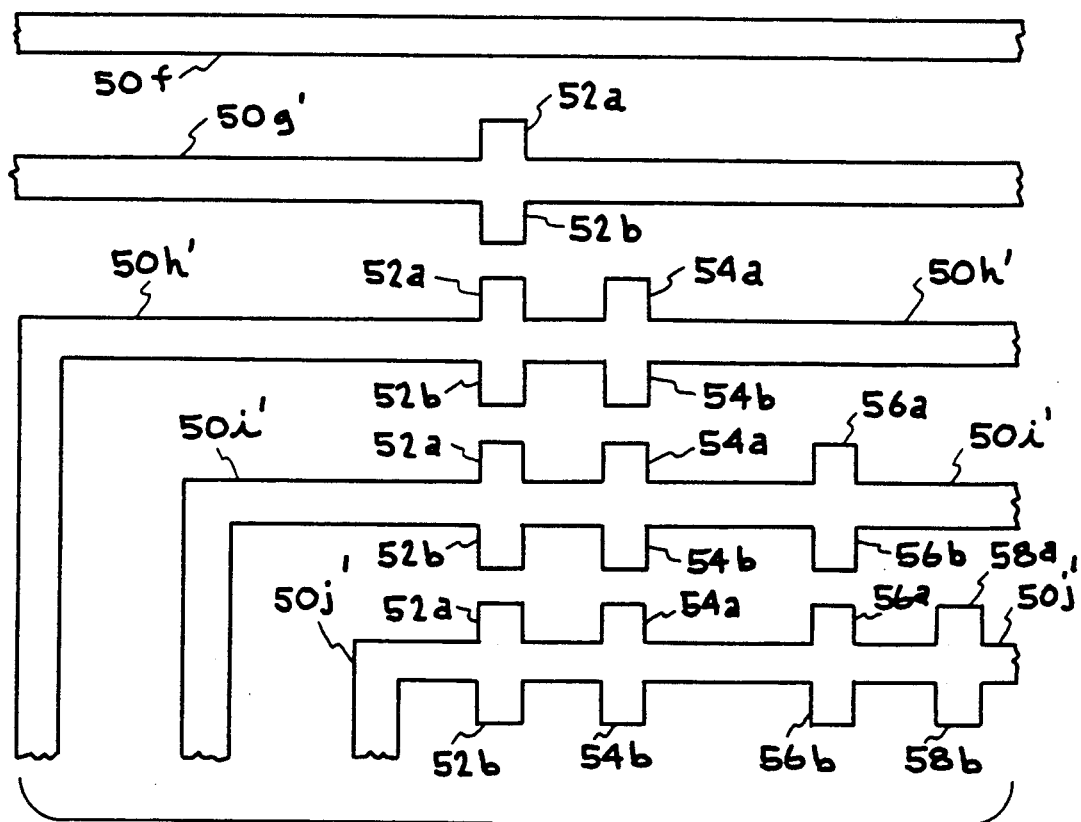
FIG. 10 is a fragmentary top view of an alternate embodiment of the invention wherein several adjacent leads of one lead pattern are shown with structural modifications to electrically compensate for the difference in lead lengths between leads.

FIG. 10 illustrates an alternate or supplemental embodiment of the invention wherein the electrical imbalance created by the uneven lengths of the leads in the respective lead patterns are compensated for by providing small side lead paths forming capacitive-loading networks which electrically act as extensions of the lead path. Such extensions may be used on either lead patterns 40 or 50 or preferably, will be used on both lead patterns.

Thus, lead 50f, corresponding to lead 50f shown in FIGS. 4 and 5, is the longest lead in the illustrations and is, therefore, not shown with any lead path extenders. Lead 50g', the next shorter lead is provided, in this embodiment, with a single lead path extender comprising side portions 52a and 52b which extend the effective electrical length or path to balance the path with the longer path of lead 50f. In similar fashion, lead 50h' is provided with path extenders 52a and 52b as well as extenders 54a and 54b, while lead 50i' is provided with three lead path extenders, 52a and 52b, 54a and 54b, and 56a and 56b. Lead 50j', the shortest lead in the illustration, is provided with lead extensions 52a and 52b, 54a and 54b, 56a and 56b, and 58a and 58b.

Figure 11:
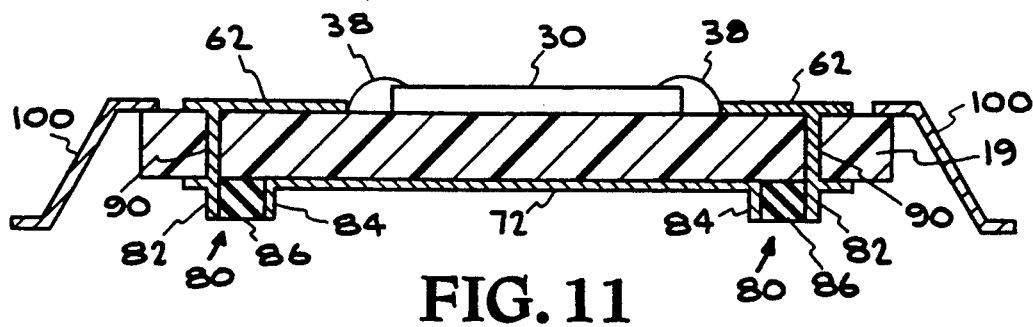
FIG. 11 is a side section view of another alternate embodiment of the invention wherein the lead assembly structure is shown with a die mounted on the top surface of the lead assembly structure and decoupling capacitor means mounted to the opposite surface of the lead assembly structure and electrically connected between the power and ground electrodes to reduce power supply voltage transients.
Figure 12:
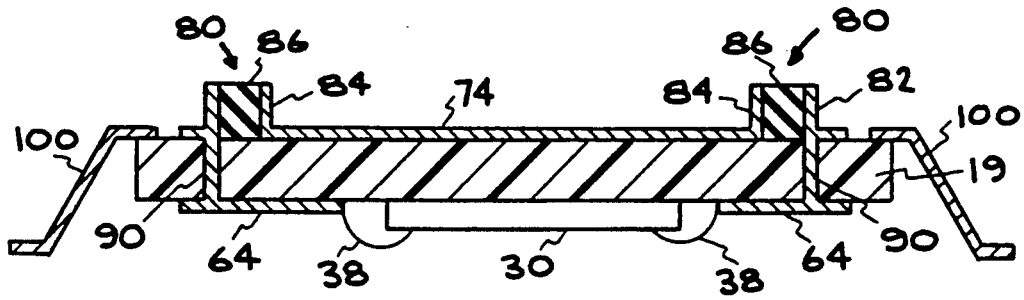
FIG. 12 is a side second view of another embodiment of the invention wherein the die and the decoupling capacitor means are mounted on opposite sides of the lead assembly structure from the mounting shown in FIG. 11.

Turning to FIGS. 11 and 12, yet another embodiment is shown wherein decoupling capacitors 80, comprising first electrode 82 and second electrode 84 separated by dielectric 86 may be mounted directly to a pc board laminate 19 with capacitor electrode 84 in direct electrical communication with ground electrode 72 in FIG. 11 or ground electrode 74 in FIG. 12. The other electrode 82 of capacitor 80 communicates with power line 62 in FIG. 11 or power line 64 in FIG. 12 through a via or plated-through hole 90 which passes through pc laminate 19. The intermediate layers and the lead patterns thereon have not been shown in FIG. 11 and 12 for the sake of clarity and simplicity.

The basic difference between FIG. 11 and FIG. 12 is the mounting of die 30 either on the top surface of pc laminate 19, as shown in FIG. 11 or on the bottom surface, as shown in FIG. 12. In either case, for convenience, capacitors 80 are mounted on the opposite surface from the mounting of die 30. In either case, as shown by holding brackets or jigs 100, the use of a pc board laminate, in accordance with the invention, permits the mounting of capacitors 80 thereto prior to encapsulating the entire structure in a plastic material such as, for example, an epoxy or polyimide material.

Thus, the use of such a pc board laminate permits the use of decoupling capacitors in plastic-encapsulated integrated circuit structures where previously there was no place to mount the capacitor prior to encapsulation. It should be noted, however, that any of the described integrated circuit lead assemblies of the invention may be used with either plastic or ceramic packaging.

The lead assembly structure of the invention thus provides a lead arrangement wherein crosstalk or coupling between adjacent leads is minimized or eliminated by the placement of leads from adjacent bonding pads on opposites sides of a pc board and by the crossing of such adjacent leads at right angles to one another as well as by the additional lead spacing made possible by such use of two lead patterns with right angle crossing of the leads in the respective lead patterns. Furthermore, the use of only a single bend in each trace, as compared to multiple conventional bends which sometimes occur in some traces to conserve space, minimizes discontinuities and signal reflections.

Having thus described the invention, what is claimed is:

1. An integrated circuit lead assembly structure comprising at least one generally rectangular pc board having a first lead pattern comprising a plurality of leads disposed in a first plane parallel to and adjacent one surface of said pc board and a second lead pattern comprising a plurality of leads disposed in a second plane parallel to said first plane and adjacent the opposite surface of said pc board with at least a part of every lead in said first lead pattern disposed adjacent said one surface of said pc board extending laterally in said first plane perpendicular to corresponding parts of every lead in said second lead pattern extending laterally in said second plane disposed adjacent said opposite surface of said pc board to reduce crosstalk and coupling between said leads in said first lead pattern and said leads in said second lead pattern.

2. The integrated circuit lead assembly structure of claim 1 wherein said pc board is further provided with spaced apart bonding pads mounted on said one surface of said board in a rectangular mounting pad array around a central die-mounting portion with generally alternate bonding pads electrically communicating through vias or plated-through holes with respective leads of said second lead pattern positioned generally adjacent said opposite surface of said pc board with a majority of the remaining bonding pads electrically communicating with leads of said first lead pattern disposed adjacent said one surface of said pc board so that adjacent bonding pads communicate with leads on opposite surfaces of said pc board.

3. The integrated circuit lead assembly structure of claim 2 wherein:
   (a) said first lead pattern disposed in said first plane parallel to said one surface of said pc board comprises:
      (1) generally straight leads extending in parallel from two opposite sides of said rectangular bonding pad array to the outer edges of two opposite sides of said rectangular pc board; and
      (2) leads extending from the other two sides of said rectangular bonding pad array parallel from said bonding pads and then turning at right angles in staircase fashion to extend parallel to one another and parallel to said leads extending from said first two opposite sides of said bonding pd array;
   so that all of said leads in said first lead pattern disposed in said first plane parallel to said one surface of said pc board terminate on two opposite end edges of said pc board; and
   (b) said leads in said second lead pattern are similarly disposed adjacent said opposite surface of said pc board, so that said two lead patterns in said two parallel planes are rotated perpendicular to one another so that all of the leads of said first lead pattern disposed adjacent said one surface of said pc board terminate on he two opposite outer edges of said pc board adjacent to the two opposite outer edges of said pc board at which the leads of said second lead pattern disposed adjacent said opposite surface of said pc board terminate;
   so that all leads in said second pattern are disposed perpendicular, along at least a portion of their lengths, to at least a portion of every lead in said first lead pattern electrically connected to adjacent bonding pads.

4. The integrated circuit lead assembly structure of claim 3 wherein means are also provided on at least a portion of said leads to electrically compensate for uneven lead lengths.

5. The integrated circuit lead assembly structure of claim 4 wherein said means for electrically compensating for uneven lead lengths further comprise means for providing capacitive loading networks to equalize the signal propagation delays.

6. The integrated circuit lead assembly structure of claim 5 wherein said means for electrically compensating for uneven lead lengths, comprising means for providing capacitive loading networks to equalize said signal propagation delays, further comprise means for effectively extending the respective electrical paths of said leads to provide substantially equal electrical lengths for said leads.

7. The integrated circuit lead assembly structure of claim 6 wherein said means for electrically compensating for uneven lead lengths further comprise one or more variations of the cross-sectional areas of said leads.

8. The integrated circuit lead assembly structure of claim 3 wherein:
   (a) said structure further comprises:
      (1) a laminate of two or more pc boards having surfaces lying in parallel planes and;
      (2) one or more power and ground electrodes positioned respectively adjacent separate surfaces of said laminate;
   (b) said first lead pattern is positioned generally adjacent and in a plane parallel to one of said surfaces of one of said pc boards in said laminate;
   (c) said second lead pattern is positioned generally adjacent and in a plane parallel to yet another of said surfaces of one of said pc boards in said laminate with portions of said leads in said first lead pattern running perpendicular to corresponding leads in said second lead pattern;
   (d) said spaced apart bonding pads are centrally mounted in said rectangular array around a central die-mounting portion adjacent an outer surface of said laminate, with generally alternate bonding pads electrically connected respectively to leads of said first and second lead patterns through vias or plated-through holes leading from the outer surface to the respective surfaces in the laminate in which the respective leads of said first and second lead patterns lie; and
   (e) one or more bonding pads are electrically connected with said power electrode and/or said ground electrode.

9. The integrated circuit lead assembly structure of claim 8 wherein an integrated circuit die is centrally mounted on said outer surface of said laminate having said rectangular array of bonding pads thereon; and bonding pads on said die are electrically connected respectively to said array of bonding pads on said outer surface of said laminate.

10. The integrated circuit lead assembly structure of claim 8 wherein one or more of said bonding pads are electrically connected through one or more vias with said ground electrode and/or said power electrode and wherein decoupling capacitor means are mounted to one outer surface of said laminate and electrically connected between said power and ground electrodes to reduce power supply voltage transients.

11. An integrated circuit lead assembly structure comprising:
   (a) a laminate of a plurality of rectangular pc boards having surfaces lying in parallel planes;
   (b) one or more power and ground electrodes positioned respectively adjacent separate surfaces of said pc boards comprising said laminate;
   (c) a first lead pattern positioned in a first plane parallel to and generally adjacent another of said surfaces of said pc boards comprising said laminate, said lead pattern comprising a plurality of leads disposed parallel to one another along at least a portion of their lengths;
   (d) a second lead pattern positioned in a second plane parallel to and generally adjacent yet another of said surfaces of said laminate, said lead pattern comprising a plurality of leads disposed parallel to one another along at least a portion of their lengths; with parts of every lead in said first lead pattern extending laterally in said first plane perpendicular to at least a part of every lead in said second lead pattern extending laterally in said second plane to reduce crosstalk and coupling between said leads of said first and second lead patterns;

(e) spaced apart bonding pads centrally mounted in a rectangular array around a central die-mounting portion adjacent an outer surface of said laminate;

(f) electrical communication means comprising vias or plated-through holes extending through one or more of said pc boards from at least some of said bonding pads to electrically connect respectively generally alternate bonding pads to leads of said first and second lead patterns; and (g) means for electrically connecting one or more of said bonding pads with said power electrode and/or said ground electrode.

12. The integrated circuit lead assembly structure of claim 11 wherein means are also provided on at least a portion of said leads to electrically compensate for uneven lead lengths.

13. The integrated circuit lead assembly structure of claim 12 wherein said means for electrically compensating for uneven lead lengths further comprise means for providing capacitive loading networks to equalize signal propagation delays.

14. The integrated circuit lead assembly structure of claim 13 wherein said means for electrically compensating for uneven lead lengths, comprising means for providing capacitive loading networks to equalize said signal propagation delays, further comprise means for effectively extending the respective electrical paths of said leads to provide substantially equal electrical lengths for said leads.

15. The integrated circuit lead assembly structure of claim 14 wherein said means for electrically compensating for uneven lead lengths further comprise one or more variations of the cross-sectional areas of at least some of said leads.

16. The integrated circuit lead assembly structure of claim 11 wherein decoupling capacitor means are mounted to one outer surface of said laminate and electrically connected between said power and ground electrodes to reduce power supply voltage transients.

17. The integrated circuit lead assembly structure of claim 11 wherein:

(a) said first lead pattern on said another surface of said one of said rectangular pc boards comprises:

(1) generally straight leads extending in parallel from two opposite sides of said rectangular bonding pad array to the outer edges of two opposite sides of said rectangular pc board; and (2) leads extending in parallel from said bonding pads on the other two sides of said rectangular bonding pad array and then turning at right angles in staircase fashion to extend parallel to one another and parallel to said straight leads extending from said first two opposite sides of said bonding pad array;

so that all of said leads in said first lead pattern on said another surface of said pc board terminate on first and second opposite end edges of said pc board; and (b) said second lead pattern is similarly disposed adjacent said yet another surface of one of said pc boards, so that at least a portion of said laterally extending leads in said two lead patterns disposed in said parallel planes to one another are perpendicular to one another so that all of the leads of said first lead pattern disposed adjacent said another surface of said one of said pc boards terminate on said first and second opposite outer edges of said pc board adjacent to third and fourth outer edges of said pc board surface at which said leads of said second lead pattern disposed adjacent said yet another surface of said laminate terminate;

so that all leads in said second lead pattern are disposed perpendicular along at least a part of their lengths, to at least a part of every lead in said first lead pattern electrically connected to adjacent bonding pads.

18. An integrated circuit lead assembly structure comprising:

(a) a laminate of a plurality of rectangular pc boards having surfaces lying in parallel planes;

(b) spaced apart bonding pads centrally mounted in a rectangular array around a central die-mounting portion on an outer surface of said laminate;

(c) one or more power and ground electrodes positioned respectively in planes parallel to and adjacent first and second surfaces of said pc boards comprising said laminate;

(d) a first lead pattern positioned in a plane parallel to and generally adjacent a third surface of said pc boards comprising said laminate, said first lead pattern adjacent said third surface of said laminate comprising:

(1) generally straight leads extending in parallel from two opposite sides of said rectangular bonding pad array to the outer edges of first and second opposite sides of said laminate of rectangular pc boards; and (2) leads from the other two sides of said rectangular bonding pad array extending parallel from said bonding pads and then turning at right angles in staircase fashion to extend parallel to one another and parallel to said leads extending from said first two opposite sides of said bonding pad array so that all of said leads in said first lead pattern on said third surface of said laminate terminate on said first and second opposite end edges of said laminate;

(e) a second lead pattern positioned generally in a plane parallel to and adjacent a fourth surface of said pc boards comprising said laminate with parts of every lead extending laterally in the plane of said second lead pattern perpendicular to parts of every lead extending laterally in the plane of said first lead pattern so that all of said leads of said first lead pattern disposed adjacent said third surface of said laminate terminate on said first and second opposite outer edges of said laminate adjacent to third and fourth opposite outer edges of said laminate at which each of said leads of said second lead pattern disposed adjacent said fourth surface of said pc board terminate, so that every lead in said second pattern is perpendicular along at least a part of its length, to at least a part of every lead in said first pattern to reduce crosstalk and coupling between said leads of said first and second lead patterns;

(f) electrical communication means comprising vias or plated-through holes extending through one or more of said pc boards comprising said laminate from at least some of said bonding pads to electrically connect respectively generally alternate bonding pads to said leads of said first and second lead patterns; and (g) means for electrically connecting one or more of said bonding pads with said power electrode and/or said ground electrode.

19. An integrated circuit lead assembly structure comprising:

(a) at least one generally rectangular pc board having first and second parallel and opposite surfaces thereon;

(b) a first lead pattern comprising a plurality of leads disposed on said first surface of said pc board;

(c) a second lead pattern comprising a plurality of leads disposed on said second surface said pc board;

(d) at least a part of each of said leads in said first lead pattern extending laterally on said first parallel surface of said pc board perpendicular to at least a part of each of said leads in said second lead pattern extending laterally on said second parallel surface of said pc board to reduce crosstalk and coupling between said leads in said first lead pattern and said leads in said second lead pattern.

* * * * *